(12) United States Patent
Zhang et al.

(10) Patent No.: US 10,944,001 B1
(45) Date of Patent: Mar. 9, 2021

(54) DEEP TRENCH AND JUNCTION HYBRID ISOLATION

(71) Applicant: NXP USA, Inc., Austin, TX (US)

(72) Inventors: Zhihong Zhang, Chandler, AZ (US); Xin Lin, Phoenix, AZ (US); Ronghua Zhu, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/735,029

(22) Filed: Jan. 6, 2020

(51) Int. Cl.
  *H01L 29/78* (2006.01)
  *H01L 29/08* (2006.01)
  *H01L 29/10* (2006.01)
  *H01L 29/06* (2006.01)
  *H03K 17/10* (2006.01)

(52) U.S. Cl.
  CPC ...... *H01L 29/7818* (2013.01); *H01L 29/0619* (2013.01); *H01L 29/0653* (2013.01); *H01L 29/0865* (2013.01); *H01L 29/0882* (2013.01); *H01L 29/1095* (2013.01); *H01L 29/7824* (2013.01); *H03K 17/102* (2013.01)

(58) Field of Classification Search
  None
  See application file for complete search history.

(56) References Cited

U.S. PATENT DOCUMENTS

| | | | |
|---|---|---|---|
| 7,723,800 B2 | 5/2010 | Moens et al. | |
| 8,541,862 B2 | 9/2013 | Yang et al. | |
| 9,601,564 B2 | 3/2017 | Cheng et al. | |
| 2019/0259749 A1* | 8/2019 | Ishii | H01L 29/42356 |

* cited by examiner

*Primary Examiner* — Cassandra F Cox

(57) ABSTRACT

An apparatus comprises a Laterally Diffused Metal Oxide Semiconductor (LDMOS) comprising a drain connectable to a drift region and a source connectable to a body region. A diode comprises a cathode electrically coupled to the drift region, wherein during an operating condition, the anode is charged to a bias voltage less than a high voltage applied to the drain and greater than a low voltage applied to the source. The anode is laterally displaced from the drain by a first distance. A first deep trench isolation (DTI) is proximate to the source and disposed to laterally surround the LDMOS. A shield junction is proximate to the first DTI and on an opposite side of the source, and electrically connected to the anode.

20 Claims, 6 Drawing Sheets

DEEP TRENCH AND JUNCTION HYBRID ISOLATION

FIELD

This disclosure relates generally to high voltage semiconductor devices, and more specifically to increasing an operating and isolation voltage of a Laterally Diffused Metal Oxide Semiconductor (LDMOS) and circuit block.

BACKGROUND

LDMOS devices are frequently used in high voltage applications (e.g., automotive applications), requiring high voltage under high-side operation. Such devices are also being used with the requirement of high voltage isolation between circuitry, with increasing demanding high voltage levels. In particular, for Silicon-On-Insulator (SOI) technology with a Deep Trench Isolation (DTI), the isolation voltage is limited by a Buried Oxide (BOX) thickness and a DTI sidewall oxide thickness. While, it is relatively simple to increase the BOX thickness, increasing the DTI sidewall thickness involves additional process complexity, which could lead to higher mechanical stress and thus higher defectivity levels.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Various embodiments described herein provide for improving high voltage isolation using a DTI and junction hybrid isolation structure. A hybrid isolation structure consisting of a DTI and a biased junction isolation is used to increase the voltage isolation of a circuit beyond what is achievable by using a DTI without further enhancement. Accordingly, an isolation and a maximum operating voltage are increased without incurring additional process complexity, cost or an increase of defectivity levels, (for example due to dislocation faults).

During one operating condition, a drain of an LDMOS is biased with a high voltage potential, being higher in voltage than a low voltage potential. In one example embodiment, a DTI laterally surrounds the LDMOS, and a bulk, source and gate terminal of the LDMOS are each connected to the low voltage potential (e.g., "ground" or 0V). The drain connects to a drift region of the LDMOS. The source connects to a body region of the LDMOS. Equipotential electric field lines define a voltage gradient between the drain and at least one other electrical net comprising the source terminal. By contacting the drift region with a reverse biased diode connection, outside of the conduction path between the source and the drain, at a location corresponding to a specific equipotential field line, a bias voltage potential, (or "bias potential"), is extracted. The bias voltage is chosen to correspond to a voltage being less than a maximum allowed voltage across a sidewall of the DTI, by adjusting a distance between the drain and the diode connection to the drift region. In another example embodiment, the choice of the field line corresponding to the bias voltage is further defined with a high voltage p-type implant between the cathode of the diode and the drift region. The bias voltage capacitively charges the anode of the diode, which in further connected to a p-type region, (or a region having the same doping polarity as the anode), proximate to the DTI, thereby pinning the DTI sidewall voltage to prevent damage to the DTI from the higher operating voltage of the drain.

Figure 1:
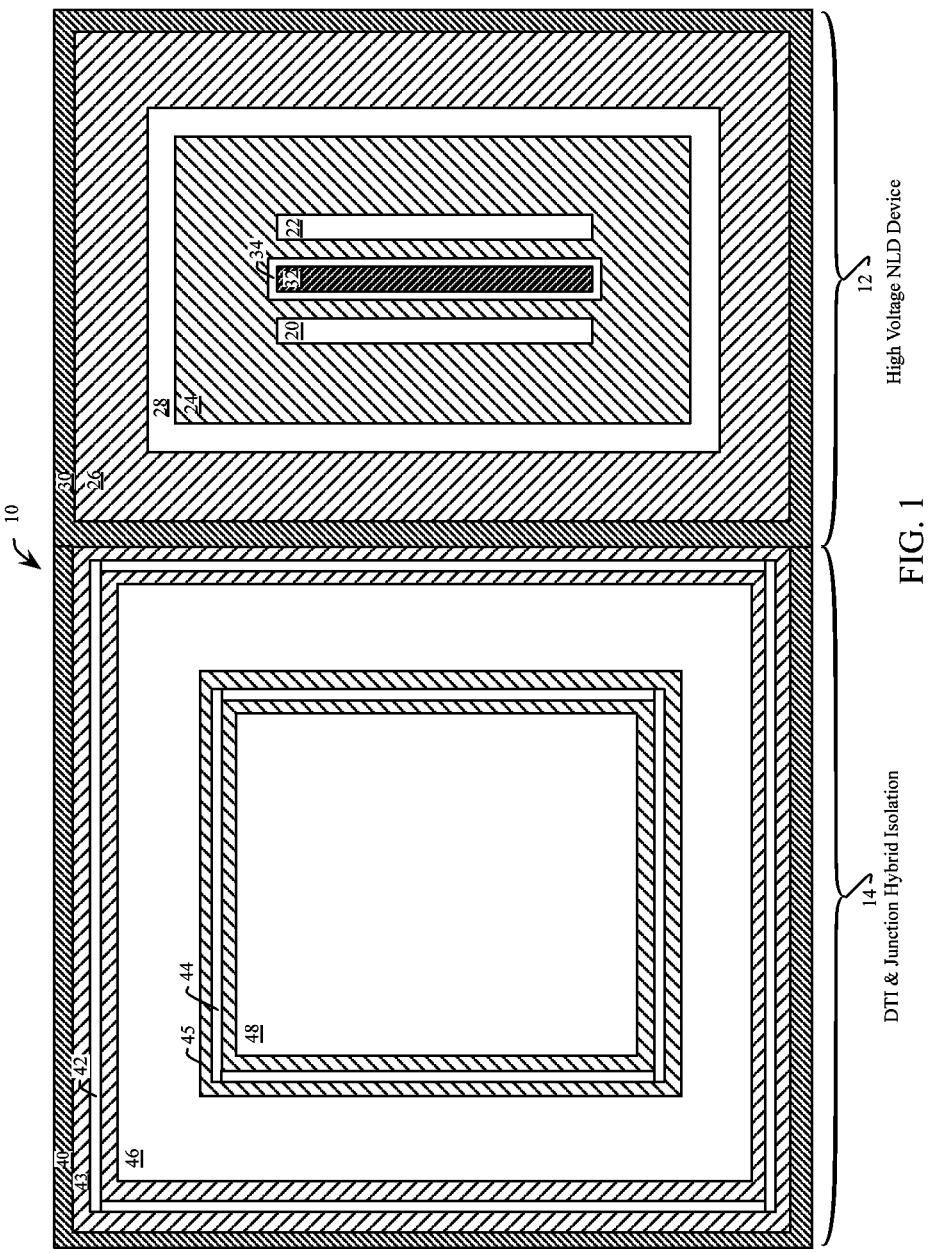
FIG. 1 is a partial plan view of a deep trench and junction hybrid isolation apparatus, in accordance with an example embodiment of the present disclosure.

FIG. 1 is a partial plan view of an example embodiment 10 of a DTI and junction hybrid isolation apparatus. A high voltage n-type LDMOS (NLD) 12 extracts the bias voltage by aligning a location of a diode with a specific equipotential field line. A DTI and junction hybrid isolation structure 14 receives the bias voltage and provides a region for additional circuitry to operate (or be isolated) from a high voltage, otherwise exceeding the normal operating limits of the DTI. The NLD 12 includes a pair of drains 20 and 22. In one example embodiment of an NLD 12, the drains 20 and 22 connect to a drift region formed by a high voltage n-type (HVN) region 24. It should be appreciated that an equivalent p-type LDMOS is formed by reversing the polarities of the implants. The HVN region 24 is separated from a p-type high voltage (PHV) region 26 by an epitaxial region 28. The HVN region 24 comprises the drift region. The PHV region 26 comprises the body region. A first DTI 30 laterally surrounds the PHV region 26 and thus the high voltage NLD device 12. A p-plus region 32 forms an anode of a diode, whose cathode, (not shown), connects to the drift region. In some embodiments, a high voltage p-type (HVP) region is formed between the cathode of the diode and the drift region.

A second DTI 40 is electrically connected to the first DTI 30. A p-plus region 42 is laterally surrounded by the second DTI 40. In one embodiment, an HVP region 43 is formed under the p-plus region 42. In one embodiment, an n-type isolation ring 44 is formed within an NHV region 45 to isolate circuitry laterally enclosed therein. The isolation ring 44 is separated from the p-plus region 42 by an epitaxial region 46. In one embodiment, a length and/or width of the isolation ring 44 are adjusted dependent upon the shape and size of the various circuits in the region 48, within the isolation ring 44.

Figure 2:
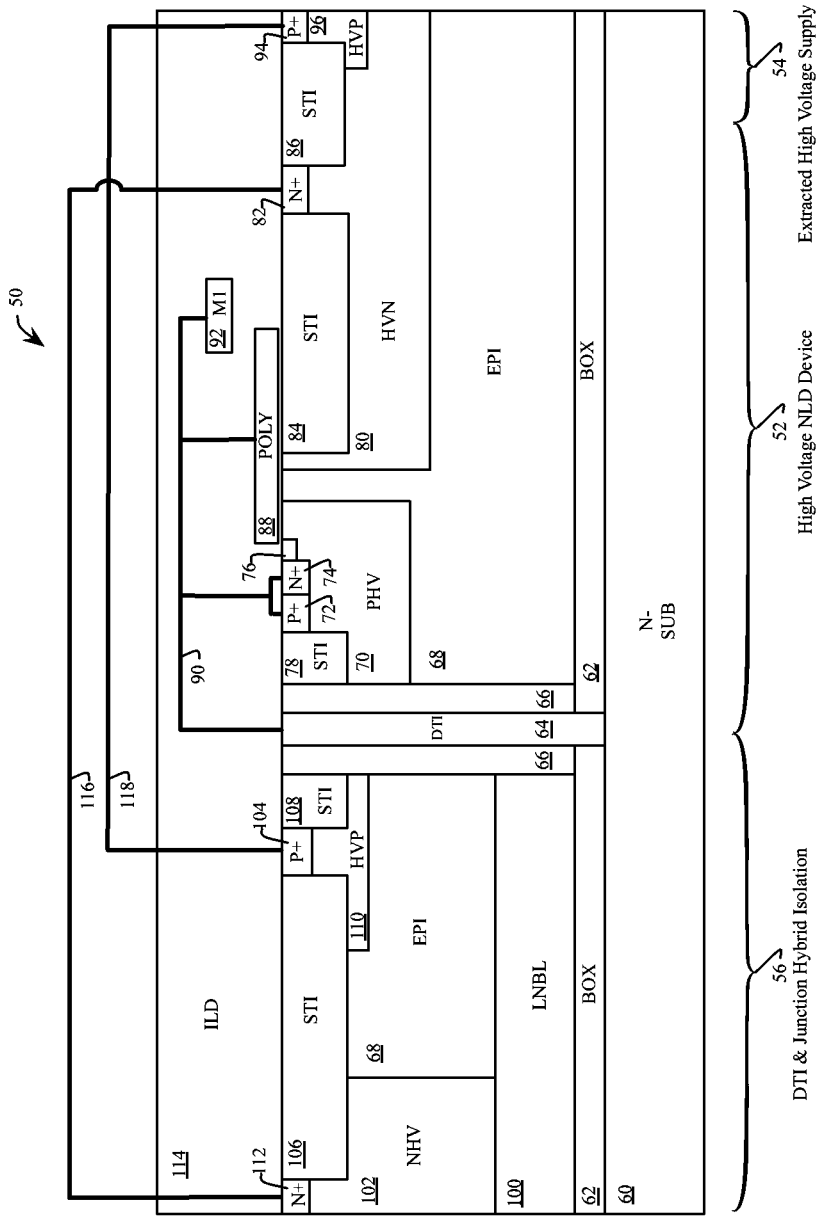
FIG. 2 is a cross-section view of a deep trench and junction hybrid isolation apparatus, in accordance with an example embodiment of the present disclosure.

FIG. 2 is a cross-section view of a deep trench and junction hybrid isolation apparatus, in accordance with an example embodiment 50 of the present disclosure. The example embodiment 50 comprises an NLD device 52, an extracted high voltage supply 54 and a DTI and junction hybrid isolation structure 56. The example embodiment 50 is formed on an n-type substrate 60, covered with a BOX layer 62. A DTI, consisting of doped polysilicon 64 and sidewall oxide 66 on either side of the polysilicon, is formed to contact the n-type substrate 60. In one embodiment, the DTI (64+66) comprises a portion of both the first DTI 30 and the second DTI 40 of FIG. 1. An epitaxial layer 68 is formed over the BOX 62 for the NLD device 52. A PHV region 70 is formed in the epitaxial layer 68, comprising the body region of the NLD device 52. A p-plus region 72 forms a bulk contact to the body region. An n-plus region 74 forms a source contact to the body region. In some embodiments, an n-type lightly doped source implant 76 is formed adjacent to the source contact. A shallow trench isolation (STI) 78 separates the bulk contact from the DTI sidewall oxide 66.

An HVN region 80 is formed in the epitaxial layer 68, comprising the drift region of the NLD device 52. An n-plus implant 82 forms a drain contact in the HVN 80. An STI 84 and an STI 86 are formed on either side of the drain contact. A polysilicon gate 88 is formed over the body and drift regions to enable the formation of a conduction channel of the NLD device 52. In one embodiment of the NLD device 52 configured for use in high voltage isolation, an interconnect 90 connects the DTI 64, the bulk and source contacts, the polysilicon gate 88, and the metal field plate 92 to a low voltage potential (e.g., ground).

A p-type implant 94 forms an anode of a diode with the HVN 80 forming the cathode. In some embodiments, the anode is separated from the HVN 80 by an HVP 96 implant. A lightly doped n-type buried layer (LNBL) 100 is formed over the BOX 62 in the DTI and junction hybrid isolation region 56. The epitaxial layer 68 is formed over the LNBL 100. An n-type high voltage region (NHV) 102 is formed over the LNBL 100. A p-type implant 104 forms a shield junction in the DTI and junction hybrid isolation structure 56. An STI 106 and an STI 108 are formed on either side of the shield junction. In one embodiment, an HVP 110 is formed under the p-plus implant 104.

An n-plus implant 112 forms a high voltage isolation ring in the NHV 102. An interlayer dielectric 114 covers the active structures of the example embodiment 50. The drain of the NLD device 52 is connected to the high voltage isolation ring and to a high voltage supply with an interconnect 116, depicted symbolically for clarity of illustration. The anode of the diode in the NLD device 52 is connected to the shield junction with an interconnect 118, depicted symbolically for clarity of illustration. In one embodiment, the interconnect 116 and 118 are formed with metal interconnect similar to the shown interconnect line 90.

Figure 3:
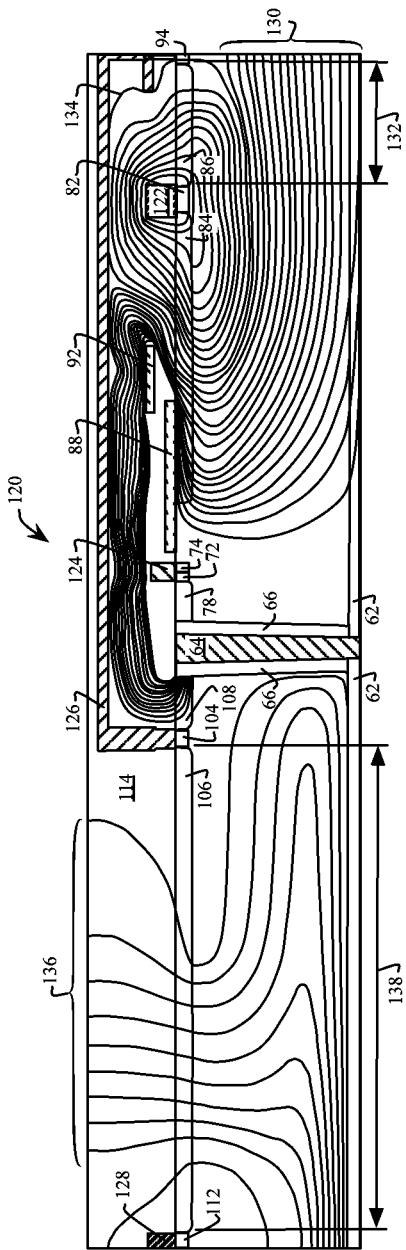
FIG. 3 is an example embodiment of an electrostatic potential profile of FIG. 2, showing equipotential field lines at the breakdown condition of a hybrid isolation structure.

FIG. 3 shows an example embodiment 120 of an electrostatic potential profile of the structure of FIG. 2, wherein the gate 88, source 74, bulk 72, DTI 64 and substrate 60 are biased to the low voltage potential, and the drain 82 is biased to the high voltage potential. The example embodiment 120 includes conductors 122, 124 and 128 connecting to the drain, source (and body) and high voltage isolation ring as respectively shown in FIG. 2. The example embodiment 120 includes a conductor 126, similar to the symbolic conductor 118 of FIG. 2, for connecting the anode to the shield junction. A plurality of equipotential field lines 130 defining a voltage gradient between the drain at 82 and at least one other electrical net comprising the source at 74. For clarity of illustration, not all field lines have been shown. In the example embodiment 120, the drain is biased to a high voltage and the source is biased to a low voltage (e.g., 0V). The equipotential field lines emanate from the drain at 82 towards lower voltage conductors, including the source, bulk and gate. As shown in FIG. 1, the drain 20 (corresponding to the drain at 82 in FIG. 3) and the drain 22 are equally spaced from the anode at 94. The equipotential field lines tend to be parallel to the BOX or to the surface below the drain of the example embodiment 120, but change direction between the drain and the anode at 94.

By separating the anode at 94 from the drain at 82, by a first distance 132, a specific equipotential field line 134 will intersect the anode and thereby cause the anode to be charged to a bias voltage potential. In one embodiment, the first distance 132 is further adjusted by the introduction of the HVP implant 96 of FIG. 2. The bias voltage potential is chosen to be less than a maximum allowed voltage across a sidewall 66 of the second DTI 64+66 (or 40 of FIG. 1). Accordingly, the DTI sidewall 66 is shielded by the shield junction 104 to prevent the DTI sidewall 66 from being exposed to the higher voltage applied to the drain of the example embodiment 120.

An additional set of equipotential field lines 136 define a voltage gradient emanating from the high voltage isolation ring at 112. In one embodiment, the high voltage isolation ring at 112 is separated from the shield junction at 104 by a second distance 138 to minimize the disturbance of the equipotential field lines 136 on the field line 134. In practice, the second distance 138 divided by the first distance 132 should have a ratio of 3:1 or within a range of 2:1 to 6:1, to minimize adverse effects on the bias voltage.

Figure 4:
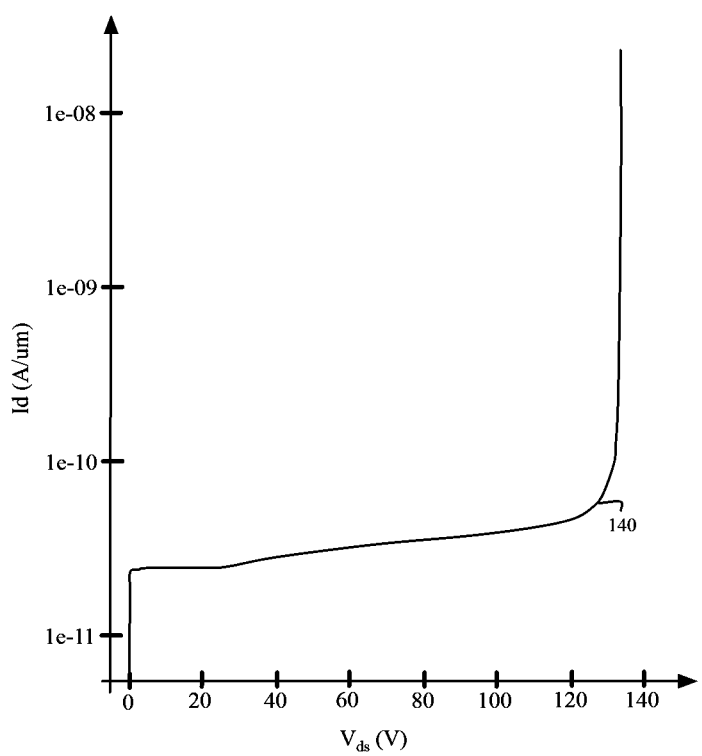
FIG. 4 is a graphical view showing a breakdown characteristic of an LDMOS, in accordance with an example embodiment of the present disclosure.

FIG. 4 shows the breakdown characteristics of the NLD device 52 of FIG. 2. In the example embodiment of FIG. 4, the breakdown voltage (BVdss) 140 of the NLD device 52 is shown at 140V, above the high side operating voltage of 120V applied to the drain at 82. In the example embodiment of FIG. 5, a bias voltage potential of 79V is applied to the shield junction, while the drain at 82 is biased to the high voltage potential of 120V.

Figure 5:
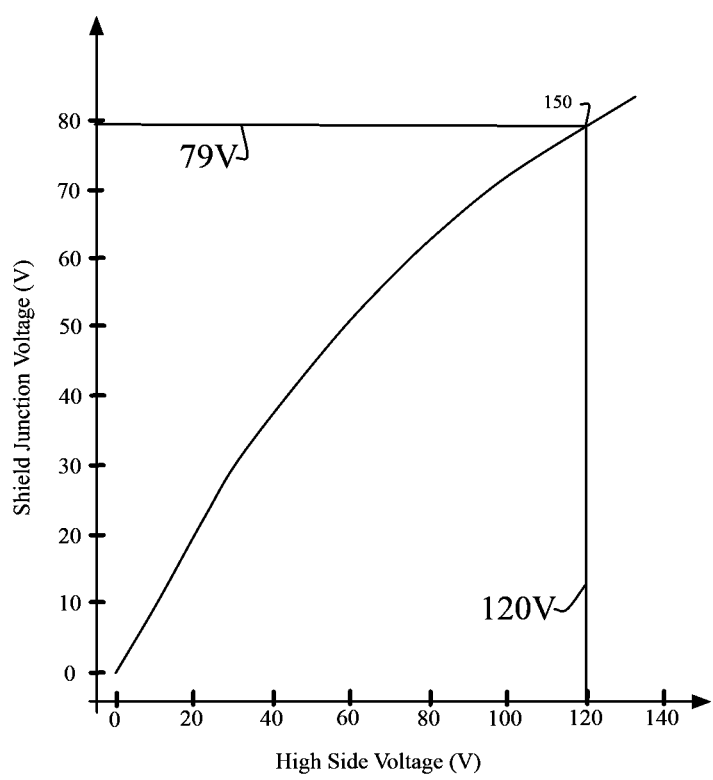
FIG. 5 is a graphical view of a bias voltage potential derived from the apparatus of FIG. 2, in accordance with an example embodiment of the present disclosure.
Figure 6:
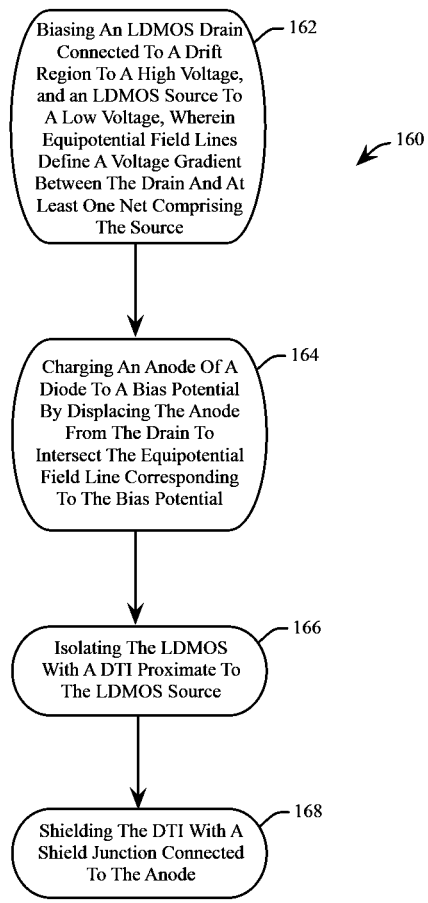
FIG. 6 is a flowchart representation of a method for deep trench and junction hybrid isolation in accordance with an example embodiment of the present disclosure.

FIG. 6, with ongoing reference to FIG. 2, FIG. 3 and FIG. 5 shows a method 160 for improving the deep trench and junction hybrid isolation in accordance with an example embodiment of the present disclosure. At 162, an LDMOS Drain at 82, connected to a drift region, is biased to a high voltage (e.g., 120V in FIG. 5). An LDMOS source is biased to a low voltage (e.g., 0V). Equipotential field lines 130 define a voltage gradient between the drain at 82 and at least one net comprising the source at 74. At 164, an anode at 94, of a diode is charged to a bias potential (79V in FIG. 5), by displacing the anode from the drain (by a distance 132), to intersect the equipotential field line 134 corresponding to the bias potential. At 166, the LDMOS is isolated with a DTI (64+66, or 30 in FIG. 1), proximate to the LDMOS source at 74. At 168, the DTI (64+66 or 30) is shielded with a shield junction at 104, connected to the anode at 94.

As will be appreciated, embodiments as disclosed include at least the following. In one embodiment, an apparatus comprises a Laterally Diffused Metal Oxide Semiconductor (LDMOS) comprising a drain connected to a drift region and a source connected to a body region. The body region is laterally separated from the drift region. The drain is connectable to a high voltage potential, and the source is connectable to a low voltage potential. A diode comprises an anode and a cathode. The cathode is electrically coupled to the drift region, wherein during an operating condition, the anode is capacitively charged to a bias voltage potential, wherein the bias voltage potential is less than the high voltage potential applied to the drain and greater than the low voltage potential applied to the source. The anode is laterally displaced from the drain by a first distance. A first deep trench isolation (DTI) is disposed to laterally surround the LDMOS. The first DTI is proximate to the source. A shield junction comprises a same doping polarity as the anode and is disposed proximate to the first DTI and on an opposite side of the source, wherein the shield junction is electrically connected to the anode.

Alternative embodiments of the apparatus include one of the following features, or any combination thereof. The first DTI is electrically connected to a second DTI, the second DTI disposed to laterally surround the shield junction, and the shield junction disposed to laterally surround a circuit. The bias voltage potential is less than a maximum allowed voltage across a sidewall of the second DTI. The maximum allowed voltage of the second DTI is less than an LDMOS breakdown voltage of the LDMOS. A high voltage isolation ring connected to the high voltage potential is laterally displaced from the shield junction by a second distance, wherein the second distance is greater than the first distance. The LDMOS is an n-type Field Effect Transistor. The LDMOS is a p-type Field Effect Transistor. The DTI is electrically connected to a second DTI, the second DTI disposed to laterally surround a circuit. A high voltage p-type implant is between the cathode and the drift region. A second drain is laterally displaced from the anode by the first distance, the second drain connectable to the high voltage potential.

In another embodiment, a method for deep trench and junction hybrid isolation comprises biasing a Laterally Diffused Metal Oxide Semiconductor (LDMOS), comprising biasing a drain connected to a drift region to a high voltage potential and biasing a source connected to a body region to a low voltage potential. An anode of a diode is charged to a bias voltage potential, wherein a cathode of the diode is electrically coupled to the drift region. The bias voltage potential is less than the high voltage potential and greater than the low voltage potential, and the anode laterally displaced from the drain by a first distance. The LDMOS is electrically isolated with a first deep trench isolation (DTI) disposed to laterally surround the LDMOS. The first DTI is proximate to the source. The first DTI is shielded with a shield junction disposed proximate to the first DTI, wherein the shield junction is electrically connected to the anode.

Alternative embodiments of the method for deep trench and junction hybrid isolation include one of the following features, or any combination thereof. The first DTI is electrically connected to a second DTI, wherein the second DTI is disposed to laterally surround the shield junction, and the shield junction is disposed to laterally surround a circuit. The bias voltage potential is less than a maximum allowed voltage across a sidewall of the second DTI. The maximum allowed voltage of the second DTI is less than an LDMOS breakdown voltage of the LDMOS. A high voltage isolation ring is laterally displaced from the shield junction by a second distance, wherein the second distance is greater than the first distance. The cathode is separated from the drift region with a high voltage p-type implant. A second drain is laterally displaced from the anode by the first distance, wherein the second drain is connected to the high voltage potential.

In another embodiment, an apparatus comprises a first Field Effect Transistor (FET) comprising a drain connected to a drift region and a source connected to a body region, the drain connectable to a high voltage potential, the source connectable to a low voltage potential. A diode comprises an anode and a cathode, the cathode electrically coupled to the drift region, and the anode laterally displaced from the drain by a first distance. A first deep trench isolation (DTI) is disposed to laterally surround the first FET, the first DTI proximate to the source. A second DTI is electrically connected to the first DTI, wherein the second DTI is disposed to laterally surround a circuit. A shield junction comprises a same doping polarity as the anode and is disposed proximate to the first DTI and laterally surrounded by the second DTI, wherein the shield junction is electrically connected to the anode.

Alternative embodiments of the apparatus include one of the following features, or any combination thereof. A high voltage p-type implant is between the cathode and the drift region. A second drain is laterally displaced from the anode by the first distance, the second drain connected to the high voltage potential.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An apparatus comprising:
    a Laterally Diffused Metal Oxide Semiconductor (LDMOS) comprising a drain connected to a drift region and a source connected to a body region, the body region laterally separated from the drift region, the drain connectable to a high voltage potential, the source connectable to a low voltage potential;
    a diode comprising an anode and a cathode, the cathode electrically coupled to the drift region, wherein during an operating condition, the anode capacitively charged to a bias voltage potential, wherein the bias voltage potential is less than the high voltage potential applied to the drain and greater than the low voltage potential applied to the source, and the anode laterally displaced from the drain by a first distance;
    a first deep trench isolation (DTI) disposed to laterally surround the LDMOS, the first DTI proximate to the source; and
    a shield junction comprising a same doping polarity as the anode and disposed proximate to the first DTI and on an opposite side of the source, wherein the shield junction is electrically connected to the anode.

2. The apparatus of claim 1 wherein the first DTI is electrically connected to a second DTI, the second DTI disposed to laterally surround the shield junction, and the shield junction disposed to laterally surround a circuit.

3. The apparatus of claim 2 wherein the bias voltage potential is less than a maximum allowed voltage across a sidewall of the second DTI.

4. The apparatus of claim 3 wherein the maximum allowed voltage of the second DTI is less than an LDMOS breakdown voltage of the LDMOS.

5. The apparatus of claim 1 wherein a high voltage isolation ring connected to the high voltage potential is laterally displaced from the shield junction by a second distance, wherein the second distance is greater than the first distance.

6. The apparatus of claim 1 wherein the LDMOS is an n-type Field Effect Transistor.

7. The apparatus of claim 1 wherein the LDMOS is a p-type Field Effect Transistor.

8. The apparatus of claim 1 wherein the DTI is electrically connected to a second DTI, the second DTI disposed to laterally surround a circuit.

9. The apparatus of claim 1 further comprising a high voltage p-type implant between the cathode and the drift region.

10. The apparatus of claim 1 further comprising a second drain laterally displaced from the anode by the first distance, the second drain connectable to the high voltage potential.

11. A method for deep trench and junction hybrid isolation comprising:
  biasing a Laterally Diffused Metal Oxide Semiconductor (LDMOS), comprising biasing a drain connected to a drift region to a high voltage potential and biasing a source connected to a body region to a low voltage potential;
  charging an anode of a diode to a bias voltage potential, wherein a cathode of the diode is electrically coupled to the drift region, the bias voltage potential is less than the high voltage potential and greater than the low voltage potential, and the anode laterally displaced from the drain by a first distance;
  electrically isolating the LDMOS with a first deep trench isolation (DTI) disposed to laterally surround the LDMOS, the first DTI proximate to the source; and
  shielding the first DTI with a shield junction disposed proximate to the first DTI, wherein the shield junction is electrically connected to the anode.

12. The method of claim 11 further comprising electrically connecting the first DTI to a second DTI, wherein the second DTI is disposed to laterally surround the shield junction, and the shield junction is disposed to laterally surround a circuit.

13. The method of claim 12 wherein the bias voltage potential is less than a maximum allowed voltage across a sidewall of the second DTI.

14. The method of claim 13 wherein the maximum allowed voltage of the second DTI is less than an LDMOS breakdown voltage of the LDMOS.

15. The method of claim 11 further comprising laterally displacing a high voltage isolation ring from the shield junction by a second distance, wherein the second distance is greater than the first distance.

16. The method of claim 11 further comprising separating the cathode from the drift region with a high voltage p-type implant.

17. The method of claim 11 further comprising laterally displacing a second drain from the anode by the first distance, wherein the second drain is connected to the high voltage potential.

18. An apparatus comprising:
  a first Field Effect Transistor (FET) comprising a drain connected to a drift region and a source connected to a body region, the drain connectable to a high voltage potential, the source connectable to a low voltage potential;
  a diode comprising an anode and a cathode, the cathode electrically coupled to the drift region, and the anode laterally displaced from the drain by a first distance;
  a first deep trench isolation (DTI) disposed to laterally surround the first FET, the first DTI proximate to the source;
  a second DTI electrically connected to the first DTI, wherein the second DTI is disposed to laterally surround a circuit; and
  a shield junction comprising a same doping polarity as the anode and disposed proximate to the first DTI and laterally surrounded by the second DTI, wherein the shield junction is electrically connected to the anode.

19. The apparatus of claim 18 further comprising a high voltage p-type implant between the cathode and the drift region.

20. The apparatus of claim 18 further comprising a second drain laterally displaced from the anode by the first distance, the second drain connected to the high voltage potential.

* * * * *